United States Patent
Lakshminarayanan et al.

(10) Patent No.: US 11,074,074 B2
(45) Date of Patent: Jul. 27, 2021

(54) EXTENDING OPERATIONAL LIFETIME OF SPATIAL LIGHT MODULATOR DEVICES WITH CONTENT-DEPENDENT ENCODING

(71) Applicant: TEXAS INSTRUMENTS INCORPORATED, Dallas, TX (US)

(72) Inventors: Aravind Lakshminarayanan, Plano, TX (US); Vivek Kumar Thakur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 324 days.

(21) Appl. No.: 16/291,873

(22) Filed: Mar. 4, 2019

(65) Prior Publication Data
US 2020/0210177 A1 Jul. 2, 2020

Related U.S. Application Data

(60) Provisional application No. 62/786,849, filed on Dec. 31, 2018.

(51) Int. Cl.
| | |
|---|---|
| G06F 9/30 | (2018.01) |
| H03K 7/08 | (2006.01) |
| H03K 5/156 | (2006.01) |
| H04N 9/31 | (2006.01) |

(52) U.S. Cl.
CPC ......... *G06F 9/3004* (2013.01); *H03K 5/1565* (2013.01); *H03K 7/08* (2013.01); *H04N 9/3155* (2013.01)

(58) Field of Classification Search
None
See application file for complete search history.

(56) References Cited

U.S. PATENT DOCUMENTS

2005/0162737 A1* 7/2005 Whitehead ........... H04N 9/3126
359/454

OTHER PUBLICATIONS

A.B. Sontheimer and D.J. Mehri. "Effects of Operating Conditions on DMD Hinge Memory Lifetime." IEEE 03CH37400. 41st Annual International Reliability 2003, pp. 473-477.
Texas Instruments. "DLPC300 DLP® Digital Controller for the DLP3000 DMD." DLPS023C—Jan. 2012—Revised Aug. 2015.
Texas Instruments. "Getting Started With TI DLP® Display Technology." Application Report. DLPA059C, Jan. 2015—Revised May 2018, pp. 1-20.

* cited by examiner

*Primary Examiner* — Cassandra F Cox
(74) *Attorney, Agent, or Firm* — Michelle F. Murray; Charles A. Brill; Frank D. Cimino (57) ABSTRACT

This disclosure relates to various implementations improve operational lifetime for a spatial light modulator device. One or more controllers are able to determine a target duty cycle based on an operating condition for a spatial light modulator device. The spatial light modulator device comprises one or more light modulation components that modulate light. The controllers allocate a refresh time period for encoding spatial light modulator refresh instructions based on the target duty cycle and encode spatial light modulator refresh instructions within the refresh time period. Afterwards, the controllers transmit the spatial light modulator refresh instruction to the spatial light modulator device.

20 Claims, 5 Drawing Sheets

EXTENDING OPERATIONAL LIFETIME OF SPATIAL LIGHT MODULATOR DEVICES WITH CONTENT-DEPENDENT ENCODING

RELATED APPLICATIONS

This application claims priority to U.S. Provisional Application No. 62/786,849 filed Dec. 31, 2018, which is hereby incorporated by reference in its entirety.

BACKGROUND

Spatial light modulator devices, such as digital micromirror devices (DMD), can be found in a wide range of display and light control applications that include three dimensional (3D) printing, photolithography, spectroscopy, monitors, televisions, instrument panels, projectors, signage, gaming devices, and wearable displays. To manage and steer light for a variety of display and light control applications, spatial light modulator devices include multiple light modulation components. As an example, a DMD includes an array of light modulation components known as micromirrors that receive light from one or more light sources. For image projection devices (e.g., televisions and projectors), the micromirrors are able to direct light to a projection optics component or to a collection optic component. When the micromirrors direct light to the projection optics component (e.g., an optical lens system), the projection optics component focuses and projects an image for display.

For Digital Light Processing® (DLP®) technology, one reliability concern involves DMD's hinge memory lifetime. Hinge memory refers to a residual tilt at a hinge of a micromirror. The residual tilt generally occurs as a DMD operates its mircomirrors in a single position for relatively long periods of time. For example, a micromirror that continually lands in the OFF-position may, over time, exhibit a residual tilt in a direction toward the OFF-position even when the micromirror does not receive a bias voltage for the OFF-position. Once a DMD reaches the end of the hinge memory lifetime, the hinges connected to the micromirrors may no longer function properly causing projected pixels to appear non-functional (e.g., display burn-in). In some applications, a DMD may function in operating conditions (e.g., relatively high temperatures) that could reduce its hinge memory lifetime. For illustrative and non-limiting purposes, a DMD that consistently operates at a DMD array temperature of about 30 degrees Celsius (° C.) could have a hinge memory lifetime that exceeds 100,000 hours. However, if the DMD consistently operates at a DMD array temperature at about 70° C., the hinge memory lifetime could reduce to less than 10,000 hours; thereby, shortening the operational life of the DMD.

SUMMARY

In one implementation, a non-transitory program storage device includes instructions stored thereon to cause one or more controllers to determine a target duty cycle based on an operating condition for a spatial light modulator device. The spatial light modulator device includes one or more light modulation components that modulate light. The controllers allocate a refresh time period for encoding spatial light modulator refresh instructions based on the target duty cycle and encode spatial light modulator refresh instructions within the refresh time period. Afterwards, the controllers transmit the spatial light modulator refresh instruction to the spatial light modulator device.

In another implementation, a system including: a memory that stores instructions and a controller coupled to the memory, where the instructions, when executed, cause the controller to determine a target duty cycle based on an operating condition for a spatial light modulator device and an estimated operational lifetime of the spatial light modulator device at the operating condition. The controller allocates a refresh time period for encoding refresh state bit planes based on the target duty cycle and a plurality of time periods for a plurality of bit planes for an image frame period. The controller then assigns a number of the bit planes as refresh state bit planes, where the number of the bit planes is based on the time periods of the bit planes the refresh time period. The controller then encodes the refresh state bit planes to refresh the spatial light modulator device.

In yet another implementation, a method including determining a target duty cycle based on an operating condition for a spatial light modulator device where the spatial light modulator device comprises one or more light modulation components that modulate light. The method allocates a refresh time period for encoding spatial light modulator refresh instructions based on the target duty cycle and encodes spatial light modulator refresh instructions within the refresh time period. The method also receives sensor information for the spatial light modulator device and determine whether the operating condition has changed for the spatial light modulator device based on the sensor information. The method modifies the target duty cycle based on a determination the operating condition has changed.

DETAILED DESCRIPTION

The drawings are not necessarily to scale. The same reference numerals are used in this description and the drawings for components and elements having the same structure, and primed reference numerals are used for components and elements having a similar function and construction to those components and elements having the same unprimed reference numerals. In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on."

Various example implementations are disclosed herein that extend the operational lifetime for a spatial light modulator device (e.g., a DMD). In one or more implementations, a spatial light modulator device may function in certain operating conditions (e.g., relatively high operating temperatures) that reduce the operational lifetime of the device. In one example, hinge memory lifetime for a DMD represents an estimated amount of time before the hinges connected to the micromirrors become non-functional. As the operating temperature increases for a DMD, the hinge memory lifetime decreases, which indicates that the DMD may fail within a shorter time period. To prevent the spatial light modulator device from failing, an optical system provides refresh instructions to achieve a target duty cycle that extends the operational lifetime of the spatial light modulator device. Examples of optical systems that provide and utilize spatial light modulator refresh instructions include image projecting systems (e.g., televisions, monitors, touch screens, and head mounted devices) and light control systems (e.g., programmable structured light devices, spectrometer devices, and digital exposure devices, such as a 3D printer and photolithography device).

In one or more implementations, an image projecting system provides spatial light modulator refresh instructions through content-dependent encoding. In particular, the image projecting system provides spatial light modulator refresh instructions by encoding refresh state bit planes during an image frame period. The refresh state bit planes could represent dark bit planes where the light source for the image projecting system turns off to avoid impacting color temperature. The image projecting system determines a target duty cycle and based on the target duty cycle, locates a duration within an image frame period for encoding the dark bit planes. The image projecting system utilizes the remaining image frame period for encoding color information (e.g., red, green, blue (RGB)) based on a target white point. From the allocated duration for the dark bit planes, the image projecting system establishes a total number of dark bit planes to encode within the image frame period. As an example, the image projecting system encodes dark bit planes into one or more independent color channels using the unused bit planes within each color channel. By doing so, the number of encoded dark bit planes and/or duration of the dark bit planes may vary between the independent color channels. As a result, the number of encoded dark bit planes for each color change could be based on the color ratios the image projecting system uses to generate the target white point.

For purposes of this disclosure, the term "duty cycle" is used to reference the duration of time a light modulation component within a spatial light modulator device remains in one or more states. For example, in an image projection system, a spatial light modulator device may position a light modulation component to an ON state that produces an ON pixel and an OFF state that produces an OFF pixel. In this example, a duty cycle of 20/80 represents that for a given time period (e.g., one image frame period), the spatial light modulator device positions the light modulation component 20% of the time in an ON state and 80% of the time to the OFF state for all pixels within the device. The number of states a duty cycle can represent depends on the type of light modulation component (e.g., liquid crystal versus a micromirror). Within this disclosure, the term "duty cycle" can also be referenced and interchangeable with the term "ON/OFF cycle."

As used herein, the term "spatial light modulator device" refers to device that is able to manage and modulate light received from one or more light sources. Examples of spatial light modulator devices include a liquid crystal based light engine, a DMD, and a liquid crystal on silicon based light engine. To manage and modulate light, the spatial light modulator device includes one or more "light modulation components." The term "light modulation component" refers to a component within the spatial light modulator device that directs, transmits and/or modulates light for a specified unit associated with the particular display and light control application. As an example, the specified unit in an image projection system is a pixel, where each light modulation component corresponds to one or more pixels for an image frame. Examples of a light modulation component are a liquid crystal for a liquid crystal based light engine and a micromirror for a DMD.

Figure 1:
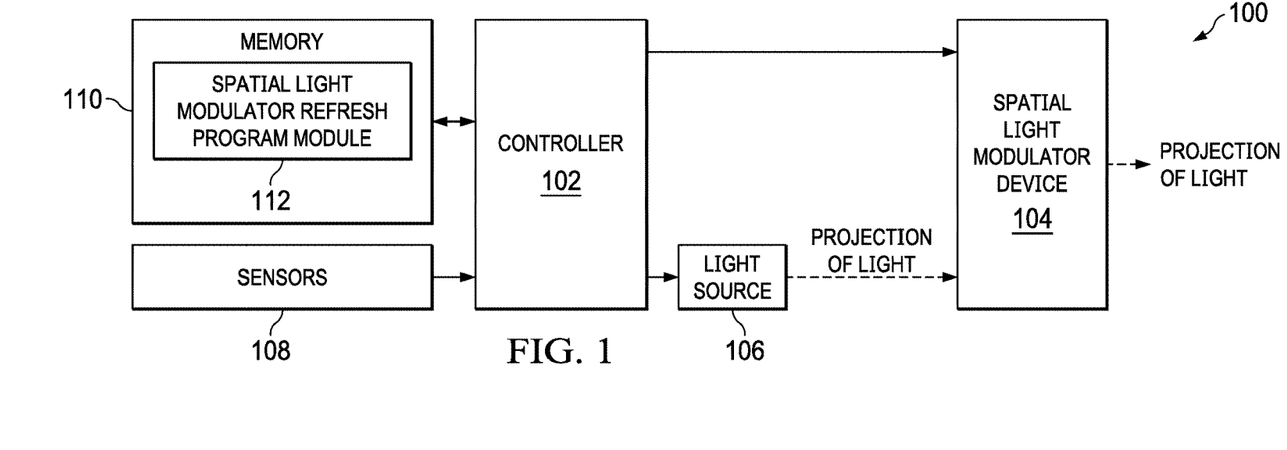
FIG. 1 is a simplified block diagram of an optical system in accordance with various implementations.

FIG. 1 is a simplified block diagram of an optical system 100 in accordance with various implementations. FIG. 1 illustrates that the optical system 100 includes components that perform operations in the electrical domain and in the optical domain. Specifically, memory 110 and controller 102 perform data formatting and processing in the electrical domain, and light source 106 and spatial light modulator device 104 perform a variety of operations in the optical domain (e.g., light modulation) according to the processed data. Sensors 108 represent components that perform operations in the electrical domain and/or in the optical domain. Examples of components sensors 108 include a temperature sensor for providing temperature information or an image sensor that is part of a camera. The optical system 100 depicted in FIG. 1 could be applicable to a variety of display and light control applications, such as 3D printing, photolithography, and image projection and display. The specific optical components used to implement the light source 106 and spatial light modulator device 104 could vary depending on the application and technology.

Light generation for optical system 100 originates from light source 106. Light source 106 could include one or more light components that produce one or more colors. Examples of colors light source 106 could produce include RGB colors and combination colors, such as yellow. Examples of light components within light source 106 could include high intensity discharge lamps (e.g., Xeon lamps), light emitting diodes (LEDs), organic LEDs, quantum dot structures, and/or solid state lasers. Controller 102 communicates with light source 106 to determine when one or more light components with light source 106 provide light to the spatial light modulator device 104. For example, controller 102 may provide instructions that power on and power off light source 106. After receiving light from light source 106, spatial light modulator device 104 acts as a spatial light modulator that manages and steers the light. The manner spatial light modulator device 104 directs light is dependent on the particular display and light control application and/or the type of spatial light modulator device 104 (e.g., liquid crystal based light engine versus DMD).

The controller 102 acts as a hardware interface between the spatial light modulator device 104 and one or more other components, such as sensors 108 and memory 110 within optical system 100. Controller 102 may represent multiple processing units or cores that are based on reduced instruction-set computer (RISC), complex instruction-set computer (CISC) architectures or any other suitable architecture. In one or more implementations, the controller 102 can be implemented using one or more central processing units (CPUs), where each CPU may contain one or more processing cores and/or memory components that function as buffers and/or data storage (e.g., cache memory). The controller 102 may also be part of or are coupled to one or more other processing components, such as, but not limited to, microcontrollers, application specific integrated circuits (ASICs), field-programmable gate arrays (FPGAs), and/or digital signal processors (DSPs).

FIG. 1 illustrates that controller 102 couples to spatial light modulator device 104 and exchanges data (e.g., image data) and commands with optical system 100. For example, controller 102 could receive input data (e.g., image data) and perform a variety of data processing operations to generate output data for the spatial light modulator device 104. The spatial light modulator device 104 then utilizes the output data to manage and steer light from light source 106 in a designated manner. The controller 102 could also provide commands that configure and control the operation of spatial light modulator device 104. As an example, the controller 102 could relay commands to spatial light modulator device 104 based on information obtained from sensors 108, such as temperature information.

In FIG. 1, memory 110 includes a spatial light modulator refresh program module 112 devised for managing and/or improving the operational lifetime for the spatial light modulator device 104. The operational lifetime represents an estimated amount of time that the spatial light modulator device is expected to continue to function properly. The spatial light modulator refresh program module 112 represents program instructions (e.g., software code or firmware) stored within memory 110. The controller 102 interfaces with memory 110 to acquire program instructions associated with spatial light modulator refresh program module 112 and subsequently performs a variety of operations based on the program instructions. For example, the program instructions could be firmware code that provides low-level control instructions on how the controller 102 communicates and interacts with spatial light modulator device 104.

To improve operational lifetime, the spatial light modulator refresh program module 112 provides program instructions that causes the controller 102 to implement and set a target duty cycle for light modulation components within the spatial light modulator device 104. The target duty cycle represents a minimum amount of time and/or a maximum amount of time a light modulation component is able to stay in one or more states. For example, when the spatial light modulator device 104 is a DMD, a target duty cycle of 20/80 represents both a minimum and a maximum amount of time a micromirror stays in two different states. Specifically, implementing a target duty cycle of 20/80 sets a micromirror to stay in one state (e.g., ON state) for at least 20% of a specified time period (e.g., minimum amount of time within an image frame) and in another state (e.g., OFF state) for no more than 80% of the same specified time period (e.g., maximum amount of time within an image frame). A micromirror would fail to satisfy the target duty cycle of 20/80 if the micromirror operated in an ON state for about 10% of a specified time period and operated in the OFF state for about 90% of the specified time period.

In one or more implementations, controller 102 can vary and adjust the target duty cycle depending on sensor information obtained from sensors 108. As previously discussed, the operational lifetime for spatial light modulator device 104 could vary depending on one or more operating conditions (e.g. operating temperature). In FIG. 1, to monitor operating conditions, sensors 108 could be part of a feedback loop that provides measured sensor information to controller 102 for evaluation. Controller 102 uses the measured sensor information to monitor the current operating conditions for spatial light modulator device 104 and/or optical system 100. Based on the measured sensor information, controller 102 can determine whether changes in the operating condition qualifies adjusting the target duty cycle. Using FIG. 1 as an example, sensors 108 is able to provide measured temperature information for spatial light modulator device 104 and/or optical system 100 to controller 102. Initially, the controller 102 sets the target duty cycle to be at 20/80 when the spatial light modulator device 104 and/or optical system 100 is operating at a temperature of 65° C. When controller 102 determines that the operating temperature drops to 60° C., the controller 102 could then adjust the target duty cycle to 15/85. In other implementations, controller 102 can receive data and/or instructions from a front-end processor to adjust the target duty cycle.

To achieve the target duty cycle, the spatial light modulator refresh program module 112 provides program instructions that cause the controller 102 to instruct the spatial light modulator device 104 to refresh its light modulation components. Refreshing a light modulation component involves changing the state of the light modulation component to a state that differs or is opposite of its state during normal operation (e.g., generating a target white point). As an example, for a display device, the light modulation component may be set to an OFF state in order to generate a black pixel for an image shown in an image frame period. When controller 102 instructs the spatial light modulator device 104 to refresh the light modulation component, the light modulation component transitions to an ON state (e.g., opposite state). By doing so, the spatial light modulator device 104 avoids having its light modulation component positioned in one state for relatively long durations of time. Exercising the light modulation component could prevent spatial light modulator device failures, such as display burn-in or stuck pixels.

The time periods for when the controller 102 refreshes the spatial light modulator device 104 could depend on the particular display or light control application. In one example, the optical system 100 may be a 3D printer that utilizes a spatial light modulator device to shine light to create a geometric pattern during an expose time period. In other time periods, such as the cure time period, the 3D printer may not utilize the spatial light modulator device 104 to shine light. During time periods the 3D printer does not use the spatial light modulator device 104, the controller 102 can cause the spatial light modulator device 104 to refresh its light modulation components. In another example, controller 102 can instruct the spatial light modulator device 104 to refresh during certain portions of an image frame period, such as motion blur reduction period, for display devices.

Although FIG. 1 illustrates a specific implementation of optical system 100, the disclosure is not limited to the specific implementation illustrated in FIG. 1. As an example, FIG. 1 may not illustrate all components found within an optical system 100, and could include other components known by persons of ordinary in the art depending on the display or light control applications. For example, optical system 100 could also include a media processor, a light source driver, and/or power management component when illuminating light. Additionally or alternatively, even though FIG. 1 illustrate that one or more components within optical system 100 are separate components, other implementations could have multiple components integrated into a single component. For illustrative purposes, memory 110 could be embedded within controller 102 and/or the spatial light modulator device 104 is embedded within controller 102. The use and discussion of FIG. 1 is only an example to facilitate ease of description and explanation.

Figure 2:
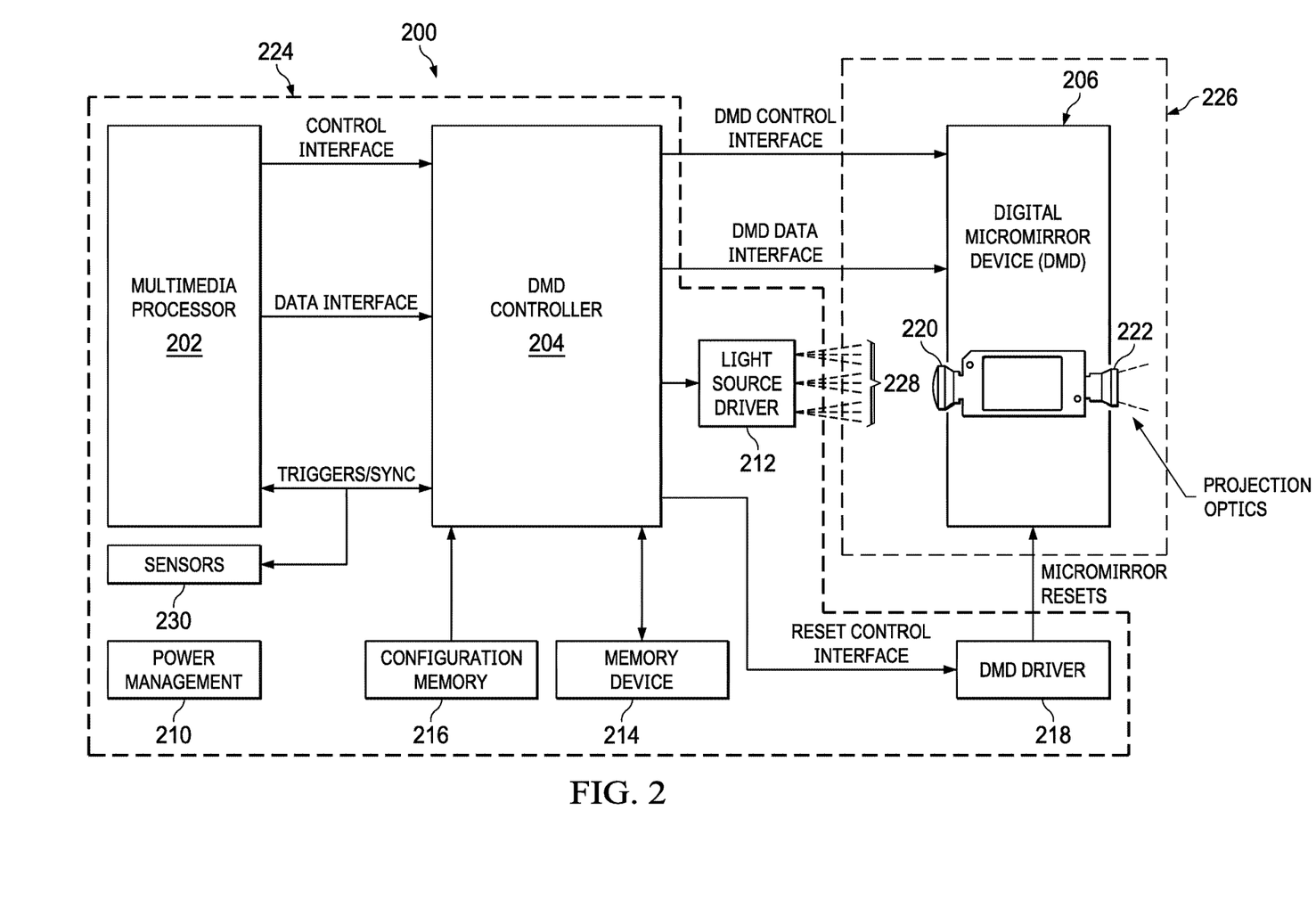
FIG. 2 is a block diagram of a DLP based optical system that exemplifies one implementation of optical system shown in FIG. 1.

FIG. 2 is a block diagram of a DLP based optical system 200 that exemplifies one implementation of optical system 100 shown in FIG. 1. FIG. 2 illustrates that DLP based optical system 200 contains an electronic processing component 224 that performs data formatting and image processing in the electrical domain and an optical processing component 226 that converts processed image data to light. The electronic processing component 224 includes a multimedia processor 202, a DMD controller 204, a power management component 210, a light source driver 212, a memory device 214, a configuration memory 216, and a DMD driver 218. The optical processing component 226 includes light source 228, a DMD 206, illumination optics 220, and projection optics component 222.

The optical processing component 226 represents the display component of the DLP based optical system 200, which could vary in size depending on the applications. Light generation for the DLP based optical system 200 originates from light source 228, which corresponds to light source 106 shown in FIG. 1. In image projection applications, light source 228 generates light that has a spectrum with wavelength peaks that align with one or more color filters (e.g., dichroic filters). In one example, light source 228 generates light that has a spectrum with wavelength peaks at RGB wavelengths. In another example, light source 228 generates light with not only RGB wavelength peaks, but also combination color wavelength peaks, such as yellow. The light from light source 228 is sent to illumination optics 220 that selectively passes light at the different wavelength peaks combines the different wavelengths of light, and illuminates the combined light onto the DMD 206. Persons of ordinary skill in the art are aware that the illumination optics 220 could perform a variety optical operations to improve color uniformity (e.g., integrator), spatial uniformity, and/or align light from light source 228 with DMD 206.

After receiving light from the illumination optics 220, DMD 206, which corresponds to spatial light modulator device 104 shown in FIG. 1, modulates light from the illumination optics 220 to projection optics component 222 or towards a collection optic component (not shown in FIG. 2). DMD 206 includes an array of micromirrors, where each micromirror mechanically and electrically couples to a corresponding torsion hinge by way of a conductive via. Each micromirror can be made to tilt and/or rotate to one position or another (e.g., +/−12 degrees) or to a neutral position through application of suitable voltages to electrodes. In one implementation, each micromirror corresponds to a pixel within an image frame. In another implementation, each micromirror corresponds to more than one pixel within the image frame. When the DMD 206 reflects light to the projection optics component 222, the projection optics component 222 include a lens array that magnifies and maps each micromirror to one or more pixels for an image projected onto a screen.

With reference to the electronic processing component 224 in FIG. 2, in one or more implementations, the multimedia processor 202 acts as a front-end controller that receives external video and/or image sources from a hardware interface, such as a High-Definition Multimedia Interface (HDMI) and Universal Serial Bus type-C (USB-C) interface. After accepting the video and/or image data, the multimedia processor 202 converts the image data into a format that the DMD controller 204 is able to utilize. For example, the multimedia processor 202 may send image data as digital data in a 24-bit RGB format to the DMD controller 204. As part of the conversion process, the multimedia processor 202 may perform a variety of front-end image processing operations that include video decoding, deserialization, deinterlacing, resizing, and/or frame rate conversion. FIG. 2 depicts that the multimedia processor 202 is able to exchange image data via the data interface and one or more commands via the control interface with the DMD controller 204.

The DMD controller 204, which corresponds to controller 102 shown in FIG. 1, couples to multimedia processor 202, DMD 206, and DMD driver 218. In FIG. 2, the DMD controller 204 is able to provide the formatted image data via the DMD data interface and commands via the DMD control interface to DMD 206. The DMD controller 204 communicates with DMD driver 218 via a reset control interface to deliver clock and/or reset signals to DMD 206. In one or more implementations, after receiving the input digital image data from the multimedia processor 202, the DMD controller 204 is able to perform a variety of image processing operations that include pixel processing operations, image-enhancement operations, artifact migration operations, and/or converting the input digital image data to a format for the DMD 206. By converting the input digital image data to a format for the DMD 206, the DMD controller 204 is able to direct light (e.g., binary pulse width modulation (PWM)) to each micromirror within DMD 206.

The power management component 210 and light source driver 212 collectively regulate voltages for the DMD controller 204, DMD 206, and other components within the DLP based optical system 200. In particular, the power management component 210 includes a power supply circuitry that supplies power to the DMD controller 204 and DMD 206. As an example, the power management component 210 may include switching regulators and manage power supply sequencing controls. Additionally, power management component 210 may include a motor driver when the DLP based optical system 200 includes a color wheel. The light source driver 212 provides driver functionality to the light source 228 and/or provide dynamic light source control based on image color content. As shown in FIG. 2, the power management component 210 and light source driver 212 may be separate components within the electronic processing component 224. In other implementations, the electronic processing component 224 may have the power management component 210 and light source driver 212 as a single integrated component, which could provide benefits, such as reduced design size.

FIG. 2 also illustrates that the DMD controller 204 is coupled to a configuration memory 216 and memory device 214. Memory device 214 and/or configuration memory 216 correspond to memory 110 shown in FIG. 1. Configuration memory 216 and memory device 214 includes one or more non-transitory storage mediums that include memory cache, flash memory, read-only memory (ROM), and/or random access memory (RAM). The configuration memory 216 includes firmware that allow developers to interface and program the DMD controller 204. Memory device 214 may store software programs, preference information, device profile information, and any other suitable data to control and manage DMD controller 204. FIG. 2 depicts the DMD controller 204, the configuration memory 216, and memory device 214 are separate components within the electronic processing component 224. In other implementations, the electronic processing component 224 may have the DMD controller 204, configuration memory 216, memory device 214, or combinations thereof as a single, integrated component.

In one or more implementations, the DMD controller 204 may perform content-dependent encoding to provide spatial light modulator refresh instructions to DMD 206. Content-dependent encoding refers to a controller's (e.g., controller 102 shown in FIG. 1 and DMD controller's 204) ability to individually control and refresh each light modulation component (e.g., micromirror) for a spatial light modulator device (e.g., DMD 206) to achieve a target duty cycle. Using FIG. 2 as an example, each micromirror within DMD 206 can map to a corresponding pixel within an image frame. Typically, the pixels within an image frame having varying colors depending on the content shown in the image frame. To account for the varying colors, DMD controller 204 provides spatial light modulator refresh instructions to DMD 206 that sets the state for each micromirror based on the content shown in the image frame. For example, an image frame that includes a black and white soccer ball would have black color pixels and white color pixels. For a given image frame period, some of the micromirrors are in an ON state to illuminate white color pixels while other pixels are in an OFF state to illuminate black color pixels. With content-dependent encoding, a DMD controller 204 provides spatial light modulator refresh instructions that simultaneously causes both the micromirrors associated with the white color pixels and the micromirrors associated with the black color pixels to refresh. Specifically, micromirrors associated with the white color pixels are moved to an OFF state and micromirrors associated with the black color pixels are moved an ON state. Being able to independently adjust the state for each light modulation component (e.g., micromirrors) provides greater flexibility and more uniform duty cycles for a spatial light modulator (e.g., DMD 206).

The DMD controller 204 embeds refresh state bit planes within an image frame period to achieve a target duty cycle that improves DMD's 206 hinge memory lifetime. As previously discussed, the target duty cycle indicates the amount a time a micromirror is positioned in an ON state and/or an OFF state. Typically, hinge memory lifetime for a DMD improves when individual micromirrors are equally set to an ON position and OFF position. For example, DMD 206 with duty cycles of about 50% in the ON position and about 50% in the OFF position has a relatively higher hinge memory lifetime than DMDs 206 with duty cycles that are less balance, such as about 10% in the ON position and about 90% in the OFF position. The DMD controller 204 is able to determine the target duty cycle based on the firmware stored in configuration memory 216 and/or operating conditions for DMD 206 and/or the DLP based optical system 200. The general concept of bit planes is discussed in more detail with reference to FIG. 3.

The DMD controller 204 utilizes the target duty cycle to allocate and determine a duration for refresh state bit planes within an image frame period. For the remaining duration of the image frame period, the DMD controller 204 encodes color information to achieve a target white point. For example, the DLP based optical system 200 has an image frame period of 10 milliseconds (ms), which signifies that a new image frame is displayed every 10 ms. If the target duty cycle has been set to a duty cycle of 20/80, the DMD controller 204 allocates 2 ms of the 10 ms image frame period for refresh state bit planes and the remaining 8 ms to encode color information for the image frame. In one implementation, the refresh state bit planes represent dark bit planes where the DMD controller 204 instructs the light source 228 to power off and not illuminate DMD 206. Turning off the light source 228 at dark bit planes allow DMD 206 to achieve the target duty cycle without impacting the color temperature of an image frame.

Based on the allocated duration for refresh state bit planes, the DMD controller 204 determines the number of refresh state bit planes to utilize for its content-dependent encoding. In one implementation, the DMD controller 204 designates unused bit planes in one or more color channels as refresh state bit planes. In other words, the dark bit planes are bit planes the DMD controller 204 does not use for encoding color information when displaying an image frame onto a screen. In particular, the number and/or duration of the refresh state bit planes in each color channel depends on the color ratio the DMD controller 204 decides to use. As an example, an image frame includes several red pixels. To encode the red pixels, the DMD controller 204 may not use bit planes in the green and blue color channels while utilizing all of the bit planes in the red color channel. When this occurs, the DMD controller 204 may encode the refresh state bit planes within the green and blue color channels, but not the red color channel. Designating DMD refresh bit planes on a per color channel basis assists in maintaining intended white point while still achieving the targeted duty DMD refresh cycle for all colors. Additionally, the DMD refresh state bit planes within the same or different color channels may be grouped together or interspersed throughout the image frame period.

In one or more implementations, the controller (e.g., controller 102 shown in FIG. 1 and DMD controller 204) for the spatial light modulator device (e.g., DMD) may implement a reverse encoding operation to encode the refresh state bit planes. The reverse encoding operation encodes values within the refresh state bit planes that complement values within the bit planes used to encode color information. By doing so, the light modulation component is able to change states for the refresh state bit planes. In FIG. 2, a DMD controller 204 is able to implement a reverse encoding operation that encodes refresh state bit planes to one or more color channels. Table 1 shown below, provides an example of a reverse encoding operation that DMD controller 204 could use that accounts for de-gamma settings.

TABLE 1

| Pixel Input | Pixel output | Data Display Bit planes | | | Refresh State Bit planes | | Achieved DC |
|---|---|---|---|---|---|---|---|
| | | State (Lower) | State (Upper) | Dither | State (Lower) | State (Upper) | |
| 0 | 0 | 0 | 0 | 0 | 16 | 16 | 20/80 |
| 1 | 0.03 | 0 | 1 | 0.0333 | 16 | 16 | 20/80 |
| 2 | 0.13 | 0 | 1 | 0.1332 | 16 | 16 | 20/80 |
| 3 | 0.29 | 0 | 1 | 0.2997 | 16 | 16 | 21/79 |
| 4 | 0.53 | 0 | 1 | 0.5328 | 16 | 16 | 22/78 |
| 5 | 0.83 | 0 | 1 | 0.8325 | 16 | 16 | 23/77 |
| 6 | 1.19 | 1 | 2 | 0.1988 | 16 | 16 | 24/76 |

TABLE 1-continued

| | | Data Display Bit planes | | | Refresh State Bit planes | | |
|---|---|---|---|---|---|---|---|
| Pixel Input | Pixel output | State (Lower) | State (Upper) | Dither | State (Lower) | State (Upper) | Achieved DC |
| 7 | 1.63 | 1 | 2 | 0.6316 | 16 | 16 | 25/75 |
| 8 | 2.13 | 2 | 3 | 0.1311 | 16 | 15 | 26/74 |
| 9 | 2.69 | 2 | 3 | 0.6972 | 16 | 15 | 28/72 |
| 10 | 3.32 | 3 | 4 | 0.3299 | 15 | 15 | 29/71 |
| 11 | 4.02 | 4 | 5 | 0.0291 | 15 | 14 | 30/70 |
| 12 | 4.79 | 4 | 5 | 0.795 | 15 | 14 | 34/66 |
| 13 | 5.62 | 5 | 6 | 0.6275 | 14 | 14 | 35/65 |
| 14 | 6.52 | 6 | 7 | 0.5265 | 14 | 13 | 38/62 |
| 15 | 7.49 | 7 | 8 | 0.4922 | 13 | 13 | 40/60 |
| 16 | 8.52 | 8 | 9 | 0.5245 | 13 | 13 | 43/57 |
| 17 | 9.62 | 9 | 10 | 0.6233 | 13 | 12 | 47/53 |
| 18 | 10.78 | 10 | 11 | 0.7888 | 12 | 11 | 49/51 |
| 19 | 12.02 | 12 | 13 | 0.0208 | 11 | 10 | 50/50 |
| 20 | 13.31 | 13 | 14 | 0.3195 | 10 | 10 | 55/45 |
| 21 | 14.68 | 14 | 15 | 0.6847 | 10 | 9 | 59/41 |
| 22 | 16.11 | 16 | 17 | 0.1165 | 8 | 8 | 60/40 |
| 23 | 17.61 | 17 | 18 | 0.615 | 8 | 8 | 66/34 |
| 24 | 19.18 | 19 | 20 | 0.18 | 7 | 7 | 70/30 |
| 25 | 20.81 | 20 | 21 | 0.8117 | 7 | 6 | 76/24 |
| 26 | 22.5 | 22 | 23 | 0.5099 | 5 | 5 | 77/23 |
| 27 | 24.27 | 24 | 25 | 0.2747 | 0 | 0 | 61/39 |
| 28 | 26.1 | 26 | 27 | 0.1061 | 0 | 0 | 65/35 |
| 29 | 28 | 28 | 29 | 0.0042 | 0 | 0 | 70/30 |
| 30 | 29.96 | 29 | 30 | 0.9688 | 0 | 0 | 75/25 |
| 31 | 32 | 32 | 32 | 0 | 0 | 0 | 80/20 |

As shown above, Table 1 depicts that the DMD controller 204 is able to encode 32 different pixel input states, 16 refresh state bit plane states, 32 data bit plane states, has a power law 2 de-gamma curve, and sets a target duty cycle of at least 20/80 (or 80/20). Using Table 1 as an example, when the pixel input is zero the refresh state bit planes is set to a complementary state of sixteen. In one or more implementations, a pixel input value 0 could represent that the micromirror is turned OFF for the entire color encoding period within image frame period (e.g., generate a black pixel), and a refresh state bit plane state of 16 represents that the micromirror is turned ON for the entire refresh state period within the image frame period. The DMD controller 204 continues to complement the pixel input values to determine and encode their corresponding refresh state bit plane state. Although Table 1 shows only 32 pixel input states as an example, other implementations could have a different number of pixel input states (e.g., up to 256 states).

Table 1 also illustrates that setting a target duty cycle of 20/80 could achieve more balanced duty cycles for a light modulation component. Having the DMD controller 204 set a target duty cycle of 20/80 does not cause the duty cycle for the light modulation component (e.g., micromirror) to maintain a 20/80 duty cycle for each pixel input value. Instead, the target duty cycle of 20/80 establishes a minimum duty cycle to balance the light modulation component (e.g., micromirror) amongst the different states. As shown in Table 1, as the pixel input increases from pixel input value 0, the achieved duty cycles for the light modulation component (e.g., micromirror) becomes more balance until the light modulation component reaches a duty cycle of 50/50 (e.g., pixel input value of 19). Afterwards, the achieved duty cycle for light modulation component becomes less balance as the pixel input value decreases (e.g., pixel input value 30). The achieved duty cycle still remains relatively more balance than the target duty cycle 20/80 until the pixel input value is 31. At that point, the light modulation component achieves a duty cycle of 80/20, which has the same balance as a duty cycle of 20/80.

In FIG. 2, the DMD controller 204 can adjust the target duty cycle based on sensor information obtained from sensors 228. The sensor information from sensors 228 could be part of a feedback loop that allows the DMD controller 204 to adjust the target duty cycle depending on measured operating conditions. When the refresh state bit planes represent dark bit planes, having a DMD controller 204 implement a target duty cycle could cause the light intensity (e.g., brightness) for an image frame. To reduce the impact that dark bit planes have on light intensity, the DMD controller 204 adjusts the target duty cycle when detecting changes in operating conditions. Using FIG. 2 as an example, sensors 228 provides measured temperature information for DMD 206 to DMD controller 204. The DMD controller 204 initially sets the target duty cycle to be at 20/80 after measuring that the DMD 206 is operating at a temperature of 65° C. Afterwards, when DMD controller 204 determines that the operating temperature drops to 60° C., the DMD controller 204 could then adjust the target duty cycle to 15/85; and thereby, increasing the light intensity for the image frame.

Although FIG. 2 illustrates a specific implementation of DLP based optical system 200, the disclosure is not limited to the specific implementation illustrated in FIG. 2. As an example, rather than having a single DMD controller 204 and a single DMD 206, other implementations of the DLP based optical system 200 could have multiple DMD controllers 204 and/or multiple DMDs 206. In one implementation, the DLP based optical system 200 could have three DMDs 206, where each separate DMD corresponds to a separate color channel (e.g., RGB color channels). Additionally, other types of controllers can implement similar content-dependent encoding operations for other types of spatial light modulator devices (e.g., liquid crystal based light engine) and/or light modulation components (e.g., liquid crystals). The use and discussion of FIG. 2 is only an example to facilitate ease of description and explanation.

Figure 3:
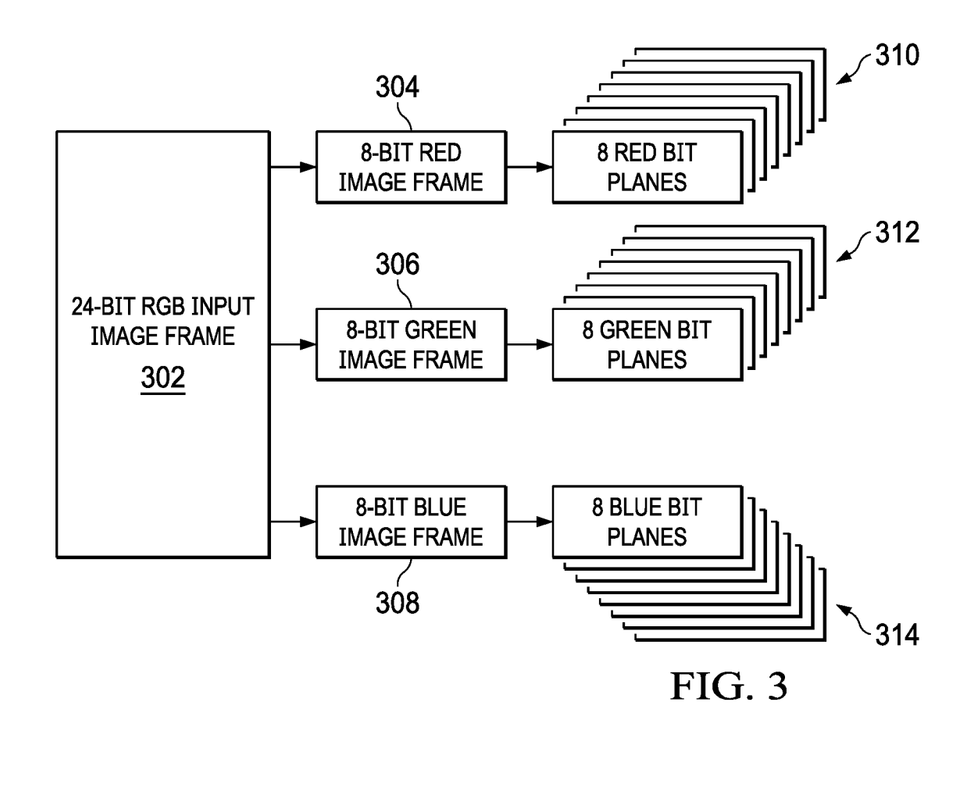
FIG. 3 illustrates that an image frame includes multiple bit planes from multiple color channels.

FIG. 3 illustrates that an example image frame that includes multiple bit planes from multiple color channels. Recall that a controller (e.g., controller 102 or DMD controller 204) may receive an input image frame and covert the input image frame into data sent to a spatial light modulator device. In FIG. 3, the 24-bit RGB input image frame 302 represents the input image frame the controller receives. The 24-bit RGB input image frame 302 is divided into three color specific image frames, an 8-bit red image frame 304, an 8-bit green image frame 306, and an 8-bit blue image frame 308. Each of the color specific image frames can be further divided into multiple bit planes. Each bit plane represents an image arrangement of one-bit extracted from all of the pixels in the 24-bit RGB input image frame 302. The number of bit planes for a color specific image frame, thus, depends on the bit depth of the color specific image frame. Using FIG. 3 as an example, since the 8-bit red image frame 304, 8-bit green image frame 306, and 8-bit blue image frame 308 each have a bit depth of eight, then each color specific image frame has 8 different bit planes. The 24-bit RGB input image frame 302 would have a total for 24 different bit planes. Specifically, the 8-bit red image frame 304 has 8 different red bit planes 310; the 8-bit green image frame 306 has 8 different green bit planes 312; and the 8-bit blue image frame has 8 different blue bit planes 314.

As previously described, pixels within an image frame, such as the 24-bit RGB input image frame 302, may not utilize all of the bit planes (e.g., red bit planes 312) to encode color information for a target white point. To implement content-dependent encoding, a controller can select and use the unused bit planes for a pixel as refresh state bit planes. Using FIG. 3 as an example, a given pixel within the 24-bit RGB input image frame 302 may utilize six of the red bit planes 310, four of the green bit planes 312, and five of the blue bit planes 312 to encode its color information. The controller can use the remaining bit planes 310, 312, and 314 to encode refresh state bit planes. In particular, the controller can select from two unused red bit planes 310, four unused green bit planes 312, and three unused blue bit planes 312 as possible refresh state bit planes for the given pixel.

The time duration allocated to each input image frame and color specific image frame depend on the constraints of the controller and/or optical system. For example, a controller may be able to receive a 24-bit RGB input image frame 302 at up to a 60 hertz (Hz) framerate. When this occurs, the controller could equally divide the 60 Hz framerate into three different section that correspond to three different color specific image frames. For example, with 60 Hz framerate, the controller could assign a 5.55 ms time slot to each color specific image frame. A controller would assign a 5.55 ms time slot to the 8-bit red image frame 304; a 5.55 ms time slot to the 8-bit green image frame 306; and a 5.55 ms time slot for the 8-bit blue image frame 308. In another example, the controller could receive the 24-bit RGB input image frame 302 at other framerates, such as 120 Hz framerate. At a 120 Hz frame rate, the controller would have allocate 2.77 ms time slots for each of the color specific image frames. Other implementations could use other methods to allocate time durations for the color specific frames.

Figure 6:
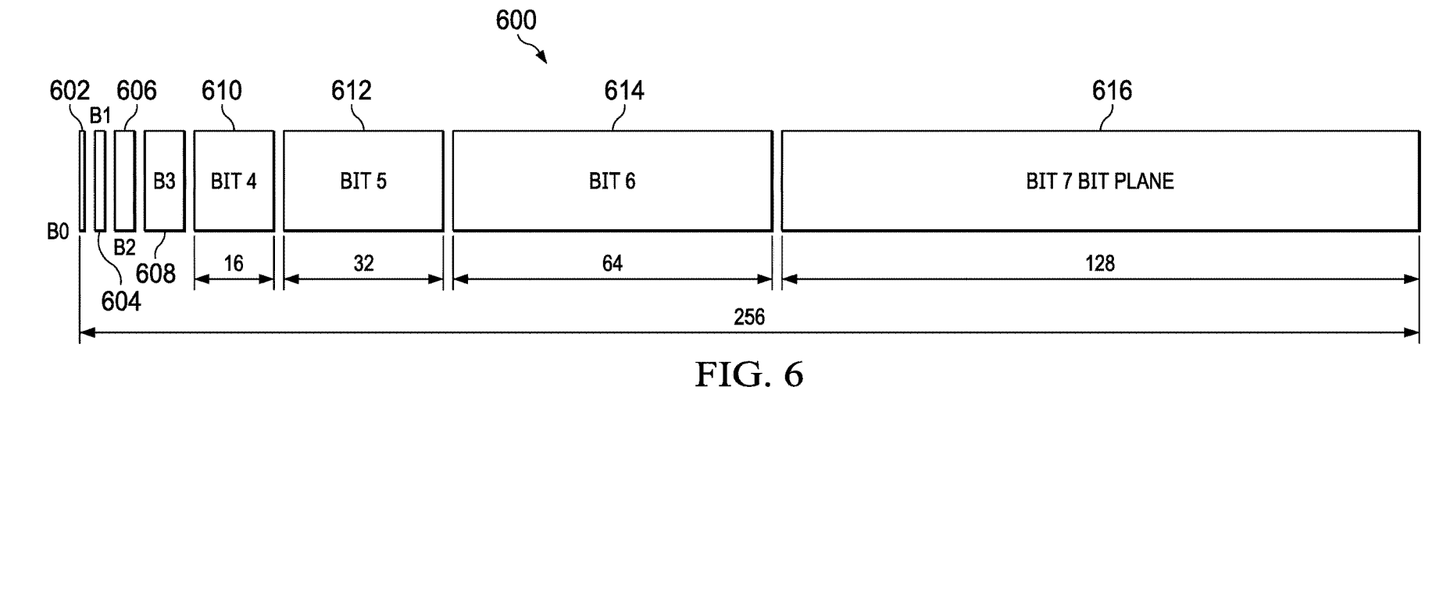
FIG. 6 illustrates a bit partition for a color specific image frame.

The controller can further divide each of the time periods allocated for the color specific image frame (e.g., 5.55 ms time slots) according to the bit planes. FIG. 6 illustrates a bit partition for a color specific image frame 600 (e.g., 8-bit red image frame 304 shown in FIG. 3). In FIG. 6, the time period allocated to the color specific image frame (e.g., 5.55 ms) is divided into 256 time slots. In other words, adding the time for all of the 256 time slots would equal the time period allocated to the color specific image frame (e.g., 5.55 ms). To divide the bit planes amongst the 256 time slots, the controller can perform binary PWM by assigning weights to the amount of time allocated for the different bit planes. Using FIG. 6 as an example, bit planes 602, 604, 606, 608, 610, 612, 614, and 616 are weighted according to a corresponding power for 2. In particular bit 7 bit plane 616 receives a weight of 128; bit 6 bit plane 614 receives a weight of 64; bit 5 bit plane 612 receives a weight of 32, bit 4 bit plane 610 receives a weight of 16, and so forth.

In one or more implementations, the length of time allocated to the selected unused bit planes affects the number of selected refresh state bit planes for a given pixel. A controller determines that to achieve a target duty cycle (e.g., duty cycle 20/80), the controller should allocate 2.27 ms for encoding spatial light modulator refresh instructions. The remaining time in the image frame period is for encoding color information. If the time period allocated to each of the color specific image frame 600 equals 5.55 ms, to achieve the target duty cycle, a controller could allocate a single bit 7 bit plane 616 as the refresh state bit plane. Alternatively, a controller could allocate two bit 6 bit planes 614 on two different color channels to satisfy the 2.27 ms condition. In another example, the controller could allocate one bit 6 bit planes 614 from one color channel and two bit 5 bit planes 612 from two color channels to satisfy 2.27 ms condition.

Figure 4:
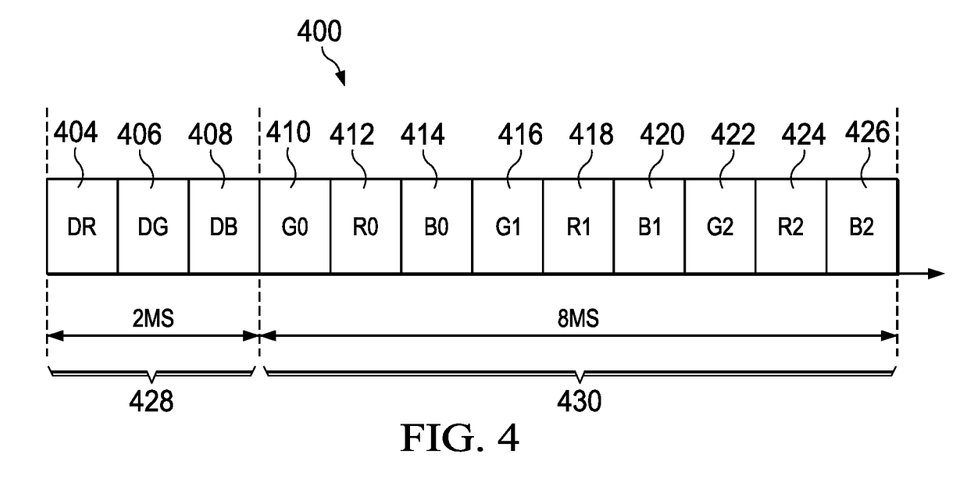
FIG. 4 illustrates a timing diagram that depict a single image frame period that includes a single refresh time period.

FIG. 4 illustrates a timing diagram that depict a single image frame period 400 that includes a single refresh time period 428. The dark bit planes 404, 406, and 408 are encoded back-to-back within the single refresh time period 428. The color bit planes 410, 412, 414, 416, 418, 420, 422, 424, and 426 are also encoded back-to-back and placed within a color encoding time period 430. As previously discussed, a controller can determine and allocate the single refresh time period 428 (e.g., 2 ms) based on the target duty cycle. To encode the spatial light modulator refresh instructions, the controller encodes dark bit planes 404, 406, and 408 with one or more color channels. Specifically, the controller encodes dark bit plane 404 with the red color channel, dark bit plane 406 with the green color channel, and dark bit plane 408 with the blue color channel. In one or more implementations, the single time period 428 corresponds to a motion blur time period for minimizing motion blur in an image frame. By having the refresh time period 428 coincide with the motion blur time period, an optical system may not suffer from a reduction in luminance (e.g., brightness level).

Figure 5:
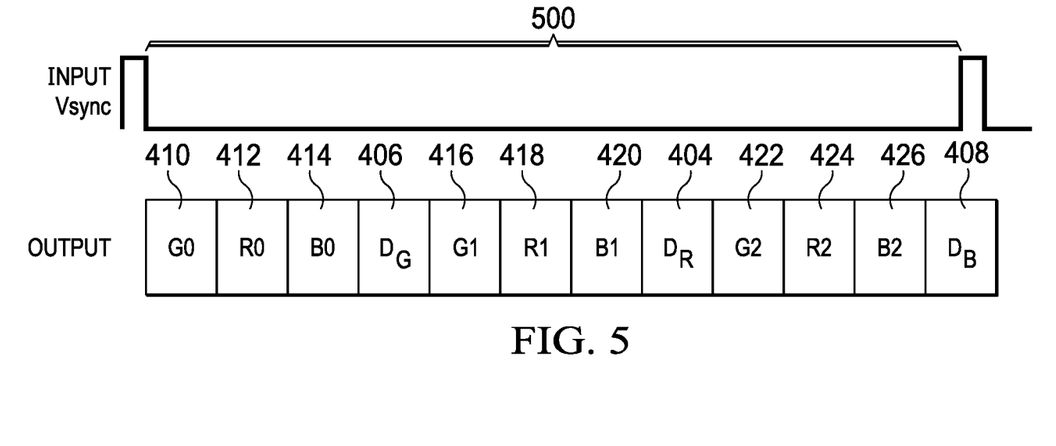
FIG. 5 illustrate a timing diagram that depict a single image frame period that includes multiple refresh time periods.

FIG. 5 illustrate a timing diagram that depict a single image frame period 500 that includes multiple refresh time periods. In FIG. 5, the dark bit planes 404, 406, and 408 are interspersed within the image frame period 500. The dark bit plane 404 is encoded between the color bit plane 420 and color bit plane 422; the dark bit plane 406 is encoded between the color bit plane 414 and 416; and the dark bit plane 408 is encoded after color bit pane 426. Having the dark bit planes 404, 406, and 408 encoded throughout the image frame period 500 and after different color bit planes, could provide the benefit of reducing color blending. In FIG. 5, to achieve the same target duty cycle for 20/80 as pervious discussed with reference to FIG. 4, the overall time allocated to encode dark bit planes 404, 406, and 408 matches the time frame for the single refresh time period 428 shown in FIG. 4.

Figure 7:
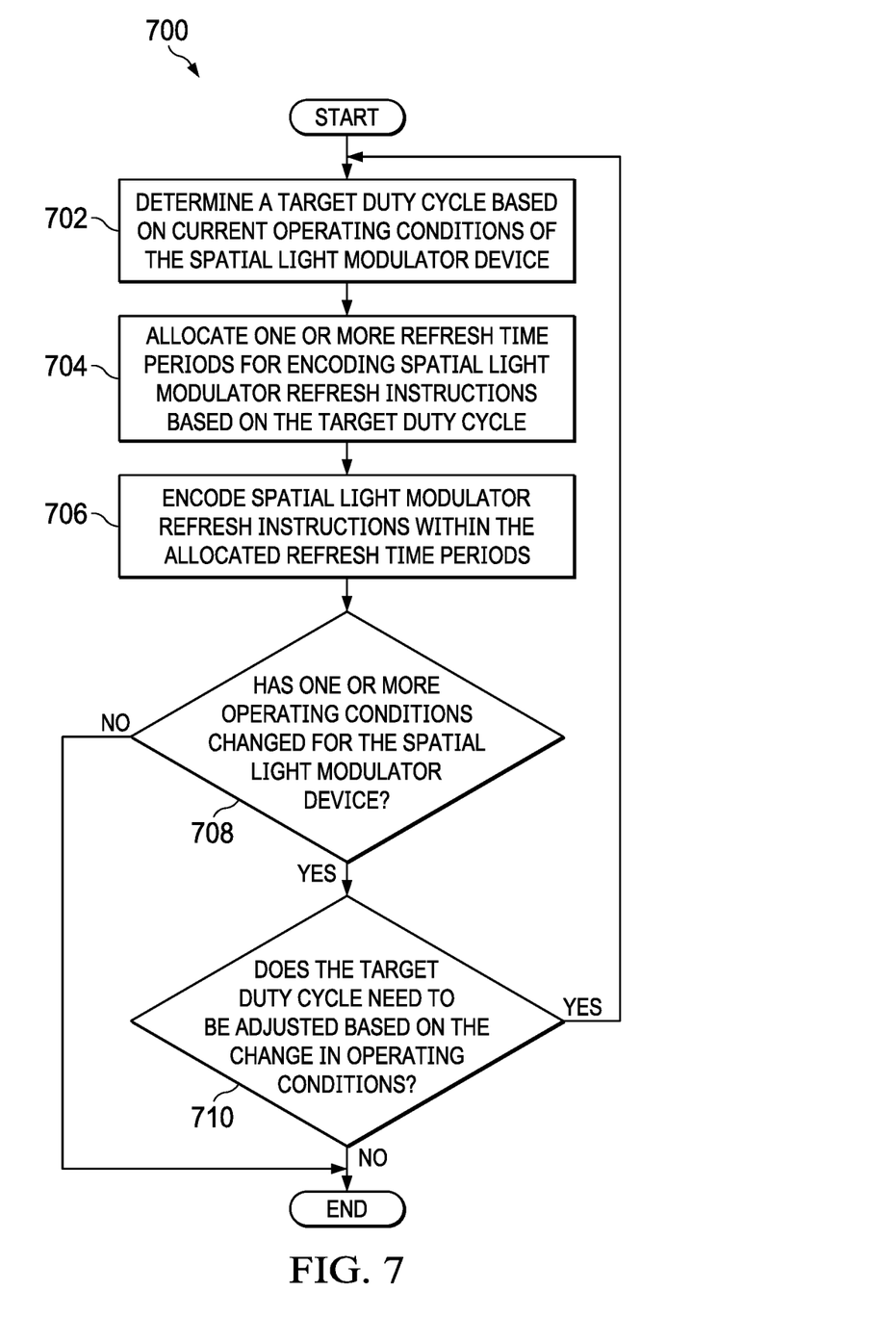
FIG. 7 is a flow chart of an implementation of a method to perform context-dependent encoding.

FIG. 7 is a flow chart of an implementation of a method 700 to perform context-dependent encoding. Using FIGS. 1 and 2 as examples, method 700 can be implemented by controller 102 and DMD controller 204, respectively. In particular, method 700 may utilize a target duty cycle and/or constraints with the optical system to provide spatial light modulator refresh instructions. Method 700 may be applicable to different types of spatial light modulator and is not limited to a DMD. Method 700 may also be implemented for a variety of display and light control applications. Although FIG. 7 illustrates that the blocks of method 700 are implemented in a sequential operation, method 700 is not limited to this order of operations, and instead other implementations of method 700 may have one or more blocks implemented in parallel operations.

Method 700 starts at block 702 to determine a target duty cycle based on current operating conditions of the spatial light modulator device. In one or more implementations method 700 may determine a target duty cycle based on operational lifetime information associated with the spatial light modulator device. For example, to determine a target duty cycle, method 700 may attempt to determine an acceptable operational lifetime for the spatial light modulator device. Additionally, method 700 could factor how the operational lifetime changes according the current operating conditions. Method 700 then moves to block 704.

At block 704, method 700 allocates one or more refresh time periods for encoding spatial light modulator refresh instructions based on the target duty cycle. As an example, method 700 could encode dark bit planes with one or more color channels in motion blur minimization periods. Alternatively, in 3D printing applications the spatial light modulator refresh instructions can be encoded during other non-exposure time periods (e.g., cure time periods). Afterwards, method 700 may move to block 706 and encode spatial light modulator refresh instructions within the allocated refresh time periods.

Method 700 then continues to block 708 to determine whether one or more operating conditions changed for the spatial light modulator device. In one implementation, method 700 may implement a feedback loop by acquiring sensor information. If the operating condition has not changed, method 700 can end. Alternatively, if the operating condition has changed, method 700 moves to block 710. At block 710, method 700 determines whether the target duty cycle needs to be adjusted based on the change in the operating conditions. If the target duty cycle needs to be adjusted, method 700 returns back to block 702; otherwise, method 700 ends.

At least one implementation is disclosed and variations, combinations, and/or modifications of the implementation(s) and/or features of the implementation(s) made by a person having ordinary skill in the art are within the scope of the disclosure. Alternative implementations that result from combining, integrating, and/or omitting features of the implementation(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

Modifications are possible in the described embodiments, and other embodiments are possible, within the scope of the claims. While several implementations have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various implementations as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. A non-transitory program storage device comprising instructions stored thereon to cause one or more controllers to:
   determine a target duty cycle based on an operating condition for a spatial light modulator device, wherein the spatial light modulator device comprises one or more light modulation components that modulate light;
   allocate a refresh time period for encoding spatial light modulator refresh instructions based on the target duty cycle;
   encode spatial light modulator refresh instructions within the refresh time period; and
   transmit the spatial light modulator refresh instructions to the spatial light modulator device.

2. The non-transitory program storage device of claim 1, wherein the refresh time period is a portion of an image frame period that includes color information for an image frame.

3. The non-transitory program storage device of claim 2, wherein the spatial light modulator refresh instructions are encoded as refresh state bit planes within the image frame period.

4. The non-transitory program storage device of claim 3, wherein the instructions further cause the one or more controllers to provide instructions to power off a light source that illuminates the spatial light modulator device during the refresh state bit planes.

5. The non-transitory program storage device of claim 3, wherein the instructions further cause the one or more controllers to allocate refresh state bit planes to unused bit planes for a first color channel and a second color channel.

6. The non-transitory program storage device of claim 5, wherein the unused bit planes are based on a target white point for the image frame.

7. The non-transitory program storage device of claim 3, wherein the instructions further cause the one or more controllers to provide instructions to determine durations for the refresh state bit planes based on pulse width modulation.

8. The non-transitory program storage device of claim 3, wherein the instructions further cause the one or more controllers to perform reverse encoding for refresh state bit planes, wherein the reverse encoding accounts for a de-gamma value and is complementary of the color information encoded in the image frame.

9. The non-transitory program storage device of claim 1, wherein the refresh time period is a portion of a cure phase of a three dimensional printing operation.

10. The non-transitory program storage device of claim 1, wherein the instructions further cause the one or more controllers to:

receive sensor information for the spatial light modulator device;
determine whether the operating condition has changed for the spatial light modulator device based on the sensor information; and
modify the target duty cycle based on a determination the operating condition has changed.

11. A system comprising:
a memory configured to store instructions; and
a controller coupled to the memory, wherein the instructions, when executed, cause the controller to:
determine a target duty cycle based on an operating condition for a spatial light modulator device and an estimated operational lifetime of the spatial light modulator device at the operating condition;
allocate a refresh time period for encoding refresh state bit planes based on the target duty cycle;
allocate time periods for bit planes for an image frame period;
assign a number of the bit planes as refresh state bit planes, wherein the number of the bit planes is based on the time periods of the bit planes the refresh time period; and
encode the refresh state bit planes to refresh the spatial light modulator device.

12. The system of claim 11, wherein refresh state bit planes are dark bit planes indicative that a light source that illuminates the spatial light modulator device is powered off.

13. The system of claim 11, wherein the spatial light modulator device is a digital micromirror device.

14. The system of claim 11, wherein the instructions that cause the controller to encode the refresh state bit planes further comprises instructions that cause the controller to perform reverse encoding for refresh state bit planes, wherein the reverse encoding accounts for a de-gamma value and is complementary of color information encoded in the image frame period.

15. The system of claim 11, wherein the instructions that cause the controller to allocate time periods for bit planes comprises instructions that cause the controller to determine the time periods for the bit planes based on pulse width modulation.

16. The system of claim 11, wherein the refresh time period corresponds to a motion blur reduction period within the image frame period.

17. The system of claim 11, wherein the operating condition is indicative of an operational temperature for the spatial light modulator device.

18. A method comprising:
determining a target duty cycle based on an operating condition for a spatial light modulator device, wherein the spatial light modulator device comprises one or more light modulation components that modulate light;
allocating a refresh time period for encoding spatial light modulator refresh instructions based on the target duty cycle;
encoding spatial light modulator refresh instructions within the refresh time period;
receiving sensor information for the spatial light modulator device;
determining whether the operating condition has changed for the spatial light modulator device based on the sensor information; and
modifying the target duty cycle based on a determination the operating condition has changed.

19. The method of claim 18, wherein the refresh time period corresponds to a motion blur reduction period within an image frame period.

20. The method of claim 18, wherein the spatial light modulator device is a liquid crystal based light engine.

* * * * *